US012382753B2

(12) United States Patent
Kawata et al.

(10) Patent No.: US 12,382,753 B2
(45) Date of Patent: Aug. 5, 2025

(54) LIGHT-EMITTING ELEMENT

(71) Applicant: NICHIA CORPORATION, Anan (JP)

(72) Inventors: Yoshitaka Kawata, Itano-gun (JP); Ryota Funakoshi, Anan (JP)

(73) Assignee: NICHIA CORPORATION, Anan (JP)

( * ) Notice: Subject to any disclaimer, the term of this patent is extended or adjusted under 35 U.S.C. 154(b) by 450 days.

(21) Appl. No.: 18/064,459

(22) Filed: Dec. 12, 2022

(65) Prior Publication Data

US 2023/0197897 A1    Jun. 22, 2023

(30) Foreign Application Priority Data

Dec. 20, 2021    (JP) .................................. 2021-206191

(51) Int. Cl.
H10H 20/825        (2025.01)
H10H 20/81         (2025.01)

(52) U.S. Cl.
CPC ........ *H10H 20/8252* (2025.01); *H10H 20/81* (2025.01)

(58) Field of Classification Search
CPC .. H10H 20/8252; H10H 20/81; H10H 20/813; H10H 20/812
See application file for complete search history.

(56) References Cited

U.S. PATENT DOCUMENTS 5,777,350 A    7/1998  Nakamura et al.
5,959,307 A    9/1999  Nakamura et al.
2001/0030318 A1   10/2001  Nakamura et al.
2002/0167019 A1   11/2002  Nakamura et al.
2003/0116767 A1    6/2003  Kneissl et al.
(Continued)

FOREIGN PATENT DOCUMENTS

JP    H09-036430 A    2/1997
JP    H09-148678 A    6/1997
(Continued)

OTHER PUBLICATIONS

Joachim Piprek, "Origin of InGaN/GaN light-emitting diode efficiency improvements using tunnel-junction-cascaded active regions", Applied Physics Letters, vol. 104, p. 051118.
(Continued)

*Primary Examiner* — Mohammad A Rahman
(74) *Attorney, Agent, or Firm* — Foley & Lardner LLP

(57) ABSTRACT

A light-emitting element includes a first n-side semiconductor layer, a first active layer, a first p-side semiconductor layer, a second n-side semiconductor layer, a second active layer, and a second p-side semiconductor layer, each made of a nitride semiconductor. The second n-side semiconductor layer includes first to third layers. The first layer includes indium and gallium and has a first n-type impurity concentration. The second layer includes indium and gallium and has a second n-type impurity concentration less than the first n-type impurity concentration. A value of a composition ratio of indium in the second layer is less than a value of a composition ratio of indium in the first layer. A thickness of the second layer is greater than a thickness of the first layer. The third layer includes gallium and has a third n-type impurity concentration less than the second n-type impurity concentration.

16 Claims, 8 Drawing Sheets

(56) References Cited

U.S. PATENT DOCUMENTS

| | | | |
|---|---|---|---|
| 2004/0066816 A1* | 4/2004 | Collins, III | H10H 29/10 257/E33.044 |
| 2008/0116477 A1 | 5/2008 | Komada | |
| 2021/0305451 A1 | 9/2021 | Kishino | |

FOREIGN PATENT DOCUMENTS

| | | |
|---|---|---|
| JP | 2004-128502 A | 4/2004 |
| JP | 2008-130878 A | 6/2008 |
| JP | 2010-251804 A | 11/2010 |
| JP | 2019-121757 A | 7/2019 |
| JP | 2021-158291 A | 10/2021 |

OTHER PUBLICATIONS

Panpan Li et al., "Demonstration of high efficiency cascaded blue and green micro? light-emitting diodes with independent junction control", Applied Physics Letters, vol. 118, p. 261104.

Shoou-Jinn Chang et al., "Cascaded GaN Light-Emitting Diodes With Hybrid Tunnel Junction Layers," Journal of Quantum Electronics, vol. 51, No. 8, p. 3300505.

* cited by examiner

LIGHT-EMITTING ELEMENT

CROSS-REFERENCE TO RELATED APPLICATIONS

This application is based upon and claims the benefit of priority from the prior Japanese Patent Application No. 2021-206191, filed on Dec. 20, 2021, the entire contents of which are incorporated herein by reference.

FIELD

Embodiments relate to a light-emitting element.

BACKGROUND

For example, JP-A 2004-128502 describes a light-emitting element including a first light-emitting part that includes a first n-type layer, a first active layer, and a first p-type layer, a tunnel junction layer located on the first light-emitting part, and a second light-emitting part that is located on the tunnel junction layer and includes a second n-type layer, a second active layer, and a second p-type layer.

SUMMARY

According to one aspect of the present invention, a light-emitting element includes, successively from a lower side to an upper side, a first n-side semiconductor layer, a first active layer, a first p-side semiconductor layer, a second n-side semiconductor layer, a second active layer, and a second p-side semiconductor layer that are made of nitride semiconductors. The second n-side semiconductor layer contacts the first p-side semiconductor layer. The second n-side semiconductor layer includes, successively from a lower side to an upper side, a first layer, a second layer, and a third layer. The first layer includes indium and gallium and has a first n-type impurity concentration. The second layer includes indium and gallium and has a second n-type impurity concentration. The second n-type impurity concentration is less than the first n-type impurity concentration. A value of a composition ratio of indium in the second layer is less than a value of a composition ratio of indium in the first layer. A thickness of the second layer is greater than a thickness of the first layer. The third layer includes gallium and has a third n-type impurity concentration. The third n-type impurity concentration is less than the second n-type impurity concentration.

DETAILED DESCRIPTION

Figure 1:
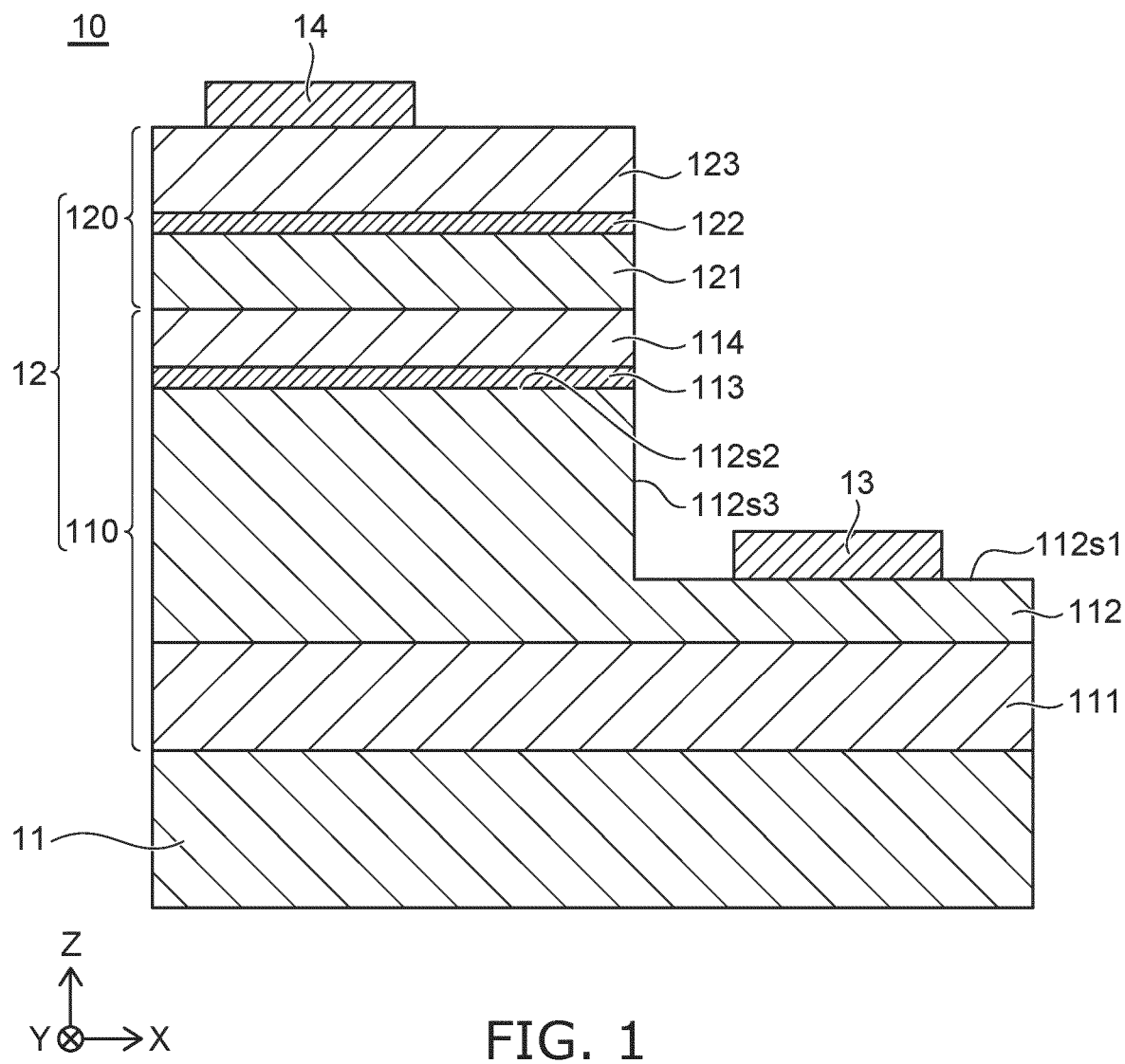
FIG. 1 is a cross-sectional view showing a light-emitting element.

Exemplary embodiments will now be described with reference to the drawings. The drawings are schematic or conceptual, and the relationships between the thickness and width of portions, the proportional coefficients of sizes among portions, etc., are not necessarily the same as the actual values thereof. Furthermore, the dimensions and proportional coefficients may be illustrated differently among drawings, even for identical portions. In the specification of the application and the drawings, components similar to those described in regard to a drawing therein-above are marked with like reference numerals, and a detailed description is omitted as appropriate.

For easier understanding of the following description, the arrangements and configurations of the portions are described using an XYZ orthogonal coordinate system. The X-axis, the Y-axis, and the Z-axis are orthogonal to each other. The direction in which the X-axis extends is taken as an "X-direction," the direction in which the Y-axis extends is taken as a "Y-direction," and the direction in which the Z-axis extends is taken as a "Z-direction." Although up is taken as the Z-direction and down is taken as the opposite direction for easier understanding of the description, these directions are relative and are independent of the direction of gravity.

FIG. 1 is a cross-sectional view showing a light-emitting element 10 according to the embodiment.

Figure 2:
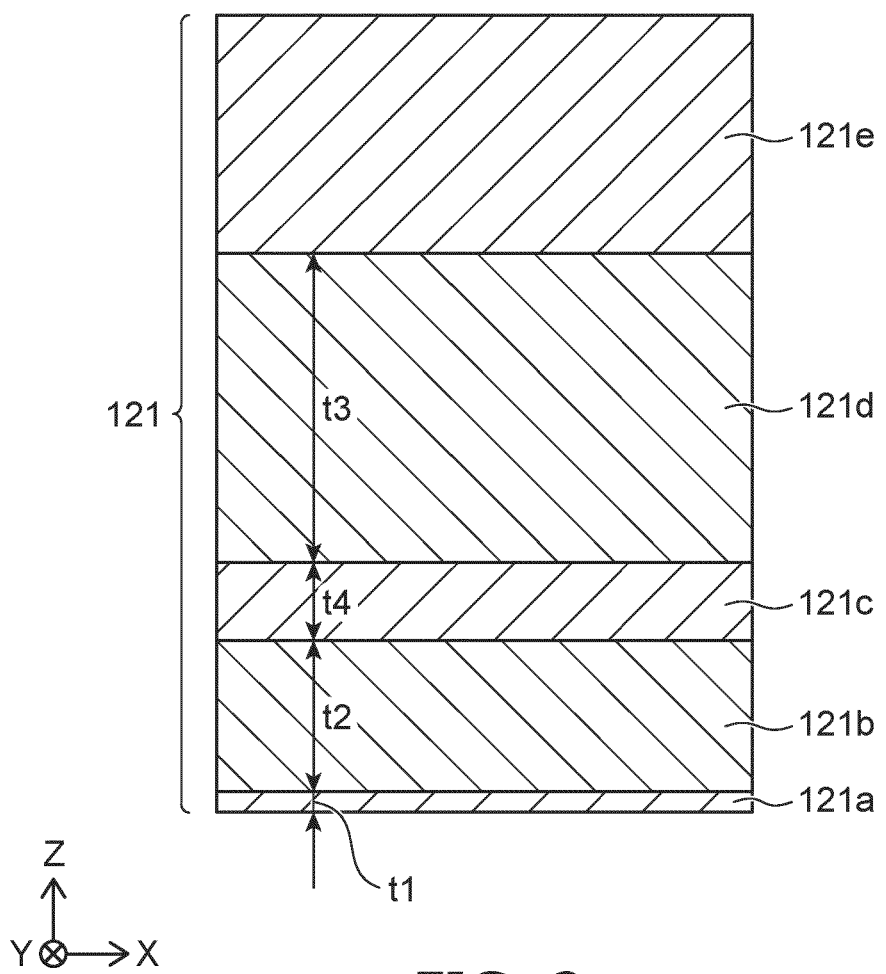
FIG. 2 is an enlarged cross-sectional view showing a second n-side semiconductor layer of FIG. 1.

FIG. 2 is an enlarged cross-sectional view showing a second n-side semiconductor layer 121 of FIG. 1.

Figure 3:
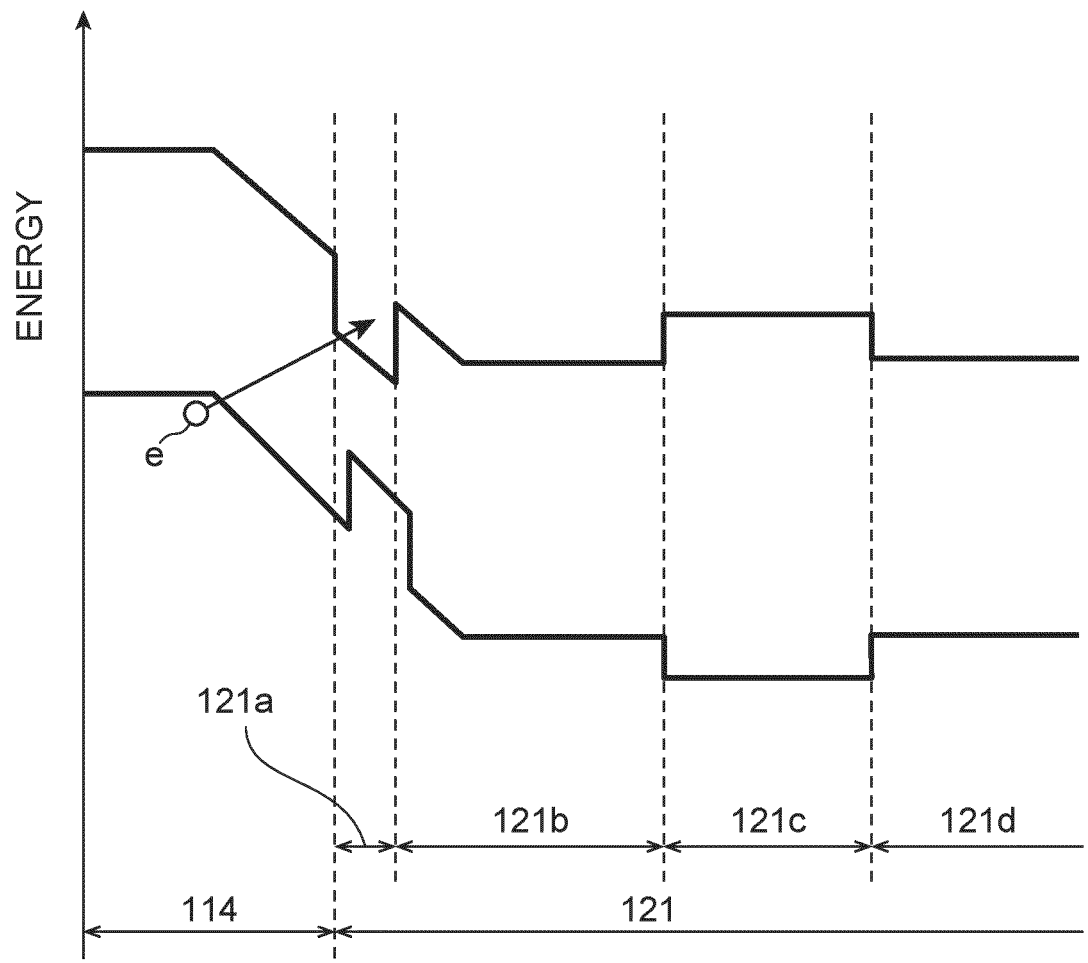
FIG. 3 is an example of an energy band diagram of the light-emitting element according to the embodiment.

FIG. 3 is an example of an energy band diagram of the light-emitting element 10 according to the embodiment.

As shown in FIG. 1, the light-emitting element 10 includes a substrate 11, a semiconductor structure body 12, an n-side electrode 13, and a p-side electrode 14.

The substrate 11 has a flat plate shape. For example, the upper surface and the lower surface of the substrate 11 are substantially parallel to the X-Y plane. For example, the substrate 11 is made of sapphire ($Al_2O_3$). However, the substrate 11 may include another material, such as silicon (Si), silicon carbide (SiC), gallium nitride (GaN), etc. The semiconductor structure body 12 is located on the substrate 11.

The semiconductor structure body 12 is, for example, a stacked body in which multiple semiconductor layers made of nitride semiconductors are stacked. In this specification, a "nitride semiconductor" is a semiconductor that includes nitrogen, and typically includes all compositions of semiconductors of the chemical formula $In_xAl_yGa_{1-x-y}N$ ($0 \leq x \leq 1$, $0 \leq y \leq 1$, and $x+y \leq 1$) for which the composition ratios x and y are changed within the ranges respectively.

The semiconductor structure body 12 includes a first light-emitting part 110 and a second light-emitting part 120 successively from a lower side to an upper side. The first light-emitting part 110 includes a first n-side semiconductor layer 112, a first active layer 113, and a first p-side semiconductor layer 114 successively from a lower side to an upper side. The first light-emitting part 110 further includes a foundation layer 111 located under the first n-side semiconductor layer 112. The second light-emitting part 120 includes the second n-side semiconductor layer 121, a second active layer 122, and a second p-side semiconductor layer 123 successively from a lower side to an upper side. The components of the semiconductor structure body 12 will now be elaborated.

The foundation layer 111 of the first light-emitting part 110 is located on the substrate 11. The foundation layer 111 includes, for example, an undoped semiconductor layer. In the specification, "undoped" means that neither an n-type impurity nor a p-type impurity is intentionally doped. In other words, an undoped semiconductor layer is a semiconductor layer formed without supplying a raw material gas including an n-type impurity and/or a p-type impurity. The term "n-type impurity" means an impurity that forms donors. The term "p-type impurity" means an impurity that forms acceptors. There are cases in which an undoped semiconductor layer that is adjacent to a layer intentionally doped with an n-type impurity and/or a p-type impurity includes the n-type impurity and/or the p-type impurity due to diffusion into the undoped semiconductor layer from the adjacent layer, etc.

The undoped semiconductor layer of the foundation layer 111 includes, for example, GaN. The first n-side semiconductor layer 112 is located on the foundation layer 111. However, the first n-side semiconductor layer may be directly located on the substrate without including the foundation layer in the first light-emitting part.

The first n-side semiconductor layer 112 includes one or more n-type semiconductor layers. The n-type semiconductor layer of the first n-side semiconductor layer 112 includes, for example, GaN doped with silicon (Si) as the n-type impurity. The n-type semiconductor layer of the first n-side semiconductor layer 112 may further include indium (In), aluminum (Al), etc. The n-type semiconductor layer of the first n-side semiconductor layer 112 may include germanium (Ge) as the n-type impurity.

It is sufficient for the first n-side semiconductor layer 112 to have a function of supplying electrons to the first active layer 113, and the first n-side semiconductor layer 112 may further include one or more undoped semiconductor layers. The undoped semiconductor layer of the first n-side semiconductor layer 112 includes, for example, GaN.

The first n-side semiconductor layer 112 includes a first surface 112s1, a second surface 112s2, and a third surface 112s3. The first surface 112s1 is substantially parallel to the X-Y plane. The second surface 112s2 is positioned higher than the first surface 112s1 and is substantially parallel to the X-Y plane. When viewed in top-view, the second surface 112s2 is next to the first surface 112s1 in the X-direction. The third surface 112s3 is positioned between the first surface 112s1 and the second surface 112s2 and is substantially parallel to the Y-Z plane. The first active layer 113 is located on the second surface 112s2.

The first active layer 113 has, for example, a multi-quantum well structure that includes multiple well layers and multiple barrier layers. The multiple well layers can include, for example, indium gallium nitride (InGaN). The multiple barrier layers can include, for example, GaN. The well layer and the barrier layer may be, for example, undoped semiconductor layers. At least portions of the well layer and the barrier layer may include an n-type impurity and/or a p-type impurity. The first p-side semiconductor layer 114 is located on the first active layer 113.

The first p-side semiconductor layer 114 includes, for example, one or more p-type semiconductor layers having a function of supplying holes to the first active layer 113. The p-type semiconductor layer of the first p-side semiconductor layer 114 includes, for example, GaN doped with magnesium (Mg) as the p-type impurity. The p-type semiconductor layer of the first p-side semiconductor layer 114 may further include Al.

The first p-side semiconductor layer 114 may further include one or more undoped semiconductor layers. The undoped semiconductor layer of the first p-side semiconductor layer 114 includes, for example, GaN. The undoped semiconductor layer of the first p-side semiconductor layer 114 may further include Al. The first p-side semiconductor layer 114 may further include a p-type upper semiconductor layer that has a tunnel junction with the second n-side semiconductor layer 121. The upper semiconductor layer includes, for example, GaN doped with Mg as the p-type impurity. For example, the p-type impurity concentration of the upper semiconductor layer is greater than the p-type impurity concentration of the p-type semiconductor layer positioned below the upper semiconductor layer in the first p-side semiconductor layer 114. The second n-side semiconductor layer 121 is located on the first p-side semiconductor layer 114.

The second n-side semiconductor layer 121 contacts the first p-side semiconductor layer 114. As shown in FIG. 2, the second n-side semiconductor layer 121 includes a first layer 121a, a second layer 121b, and a third layer 121d successively from a lower side to an upper side. According to the embodiment, the second n-side semiconductor layer 121 further includes a fourth layer 121c located between the second layer 121b and the third layer 121d, and a fifth layer 121e located on the third layer 121d.

The first layer 121a is located on the first p-side semiconductor layer 114. The first layer 121a is, for example, an InGaN layer doped with Si as the n-type impurity. It is favorable for the value of the In composition ratio of the first layer 121a to be, for example, not less than 10% and not more than 40%, and more favorably not less than 20% and not more than 40%.

The second layer 121b is located on the first layer 121a. The second layer 121b is, for example, an InGaN layer doped with Si as the n-type impurity. The value of the In composition ratio of the second layer 121b is less than the value of the In composition ratio of the first layer 121a. It is favorable for the value of the In composition ratio of the second layer 121b to be, for example, not less than 0.1% and not more than 3%.

The fourth layer 121c is located on the second layer 121b. As shown in FIG. 3, the bandgap of the fourth layer 121c is larger than the bandgaps of the first and second layers 121a and 121b. According to the embodiment, the fourth layer 121c is an AlGaN layer doped with Si as the n-type impurity. However, it is sufficient for the bandgap of the fourth layer 121c to be larger than the bandgap of the second layer 121b. The fourth layer 121c may be, for example, an aluminum indium gallium nitride (AlInGaN) layer. The value of the Al composition ratio of the fourth layer 121c is, for example, not less than 5% and not more than 35%.

As shown in FIG. 2, the third layer 121d is located on the fourth layer 121c. The third layer 121d is, for example, a GaN layer doped with Si as the n-type impurity.

The fifth layer 121e is located on the third layer 121d. For example, the fifth layer 121e has a function of supplying electrons to the second active layer 122. The fifth layer 121e can be, for example, a superlattice layer in which a GaN layer and an InGaN layer are alternately arranged. At least a portion of the semiconductor layer of the fifth layer 121e may include an n-type impurity and/or a p-type impurity.

The n-type impurity concentrations of the first layer 121a, the second layer 121b, the fourth layer 121c, the third layer 121d, and the fifth layer 121e will now be described. Herein, the n-type impurity concentration of the first layer 121a is also called the "first n-type impurity concentration"; the n-type impurity concentration of the second layer 121b is also called the "second n-type impurity concentration"; the n-type impurity concentration of the fourth layer 121c is also called the "fourth n-type impurity concentration"; the n-type impurity concentration of the third layer 121d is also called the "third n-type impurity concentration"; the n-type impurity concentration of the fifth layer 121e is also called the "fifth n-type impurity concentration."

According to the embodiment, the magnitude relationship of the n-type impurity concentrations is first n-type impurity concentration>second n-type impurity concentration fourth n-type impurity concentration>third n-type impurity concentration. Also, second n-type impurity concentration>fifth n-type impurity concentration. However, the magnitude relationship of the n-type impurity concentrations is not limited to such a magnitude relationship. For example, the fourth n-type impurity concentration may be greater than the second n-type impurity concentration. Also, for example, the fifth n-type impurity concentration may be not less than the second n-type impurity concentration.

The first n-type impurity concentration is, for example, not less than $2\times10^{20}$ cm$^{-3}$ and not more than $1\times10^{21}$ cm$^{-3}$. The second n-type impurity concentration is, for example, not less than $4\times10^{19}$ cm$^{-3}$ and not more than $2\times10^{20}$ cm$^{-3}$. The fourth n-type impurity concentration is, for example, not less than $2\times10^{19}$ cm$^{-3}$ and not more than $2\times10^{20}$ cm$^{-3}$. The third n-type impurity concentration is, for example, not less than $1\times10^{18}$ cm$^{-3}$ and not more than $2\times10^{19}$ cm$^{-3}$. The fifth n-type impurity concentration is, for example, not less than $1\times10^{18}$ cm$^{-3}$ and not more than $4\times10^{19}$ cm$^{-3}$.

A thickness t1 of the first layer 121a, a thickness t2 of the second layer 121b, a thickness t4 of the fourth layer 121c, and a thickness t3 of the third layer 121d will now be described. Herein, "thickness" means the dimension of each layer in the vertical direction.

According to the embodiment, the magnitude relationship of the thicknesses of the layers is thickness t1<thickness t4<thickness t2<thickness t3. However, the magnitude relationship of the thicknesses is not limited to such a magnitude relationship. For example, the thickness t4 may be not less than the thickness t2. Also, for example, the thickness t2 may be not less than the thickness t3.

The thickness t1 of the first layer 121a is, for example, not less than 0.1 nm and not more than 2 nm. The thickness t2 of the second layer 121b is, for example, not less than 10 nm and not more than 40 nm. The thickness t4 of the fourth layer 121c is, for example, not less than 10 nm and not more than 30 nm. The thickness t3 of the third layer 121d is, for example, not less than 80 nm and not more than 150 nm.

The functions of the first layer 121a, the second layer 121b, the fourth layer 121c, and the third layer 121d will now be described.

The first layer 121a that has a high n-type impurity concentration is located at the vicinity of the p-n junction portion formed by the first p-side semiconductor layer 114 and the second n-side semiconductor layer 121. The carrier density at the vicinity of the p-n junction portion can be increased thereby, which reduces the width of the depletion layer at the p-n junction portion and makes electron tunneling easier.

The bandgap of the first layer 121a can be reduced by increasing the value of the In composition ratio of the first layer 121a. For example, as shown in FIG. 3, a portion of the conduction band has a low energy level at the vicinity of the p-n junction portion formed by the first p-side semiconductor layer 114 and the second n-side semiconductor layer 121. As a result, the tunnel effect easily occurs between the first p-side semiconductor layer 114 and the second n-side semiconductor layer 121. Although the details are described below, for example, the electrons e that exist in the valence band of the first p-side semiconductor layer 114 easily tunnel into the conduction band of the second n-side semiconductor layer 121 when a forward voltage is applied to the light-emitting element 10.

There is a tendency for the crystallinity of a semiconductor layer to easily degrade when the value of the In composition ratio of the semiconductor layer is relatively high or when the n-type impurity concentration is relatively high. According to the embodiment, the first layer 121a has a greater value of the In composition ratio and a greater n-type impurity concentration than the second layer 121b, and the thickness t1 of the first layer 121a is less than that of the second layer 121b; therefore, the degradation of the crystallinity of the first layer 121a can be reduced.

On the other hand, by setting the second n-type impurity concentration of the second layer 121b to be less than the first n-type impurity concentration and by setting the thickness t2 of the second layer 121b to be greater than the thickness t1, the carrier density at the vicinity of the p-n junction portion formed by the first p-side semiconductor layer 114 and the second n-side semiconductor layer 121 can be increased while reducing the degradation of the crystallinity of the second layer 121b. Because the In included in the second layer 121b functions as a surfactant, the occurrence of point defects in the second layer 121b can be reduced. The diffusion of the p-type impurity included in the first p-side semiconductor layer 114 into the semiconductor layers positioned higher than the second layer 121b, such as the third layer 121d, the fifth layer 121e, etc., can be reduced thereby.

By forming the fourth layer 121c that includes Al on the second layer 121b, the point defects that occur when forming the semiconductor layers lower than the fourth layer 121c, such as the first layer 121a, etc., are filled, and the surface state of the fourth layer 121c can approach flat. By setting the fourth n-type impurity concentration of the fourth layer 121c to be not more than the second n-type impurity concentration, the degradation of the crystallinity due to the fourth layer 121c can be reduced while the second layer 121b ensures the carrier density at the vicinity of the p-n junction portion formed by the first p-side semiconductor layer 114 and the second n-side semiconductor layer 121.

Furthermore, the third layer 121d that is located higher than the fourth layer 121c has the thickness t3 that is greater than the thickness t2 and the third n-type impurity concentration that is less than the second n-type impurity concentration. The point defects that occur when forming the layers lower than the third layer 121d, such as the first layer 121a, etc., are further filled thereby, and the surface state of the third layer 121d can further approach flat. The degradation of the crystallinity of the semiconductor layers positioned higher than the third layer 121d, such as the fifth layer 121e, the second active layer 122, etc., can be reduced thereby. In particular, the luminous efficiency can be increased by reducing the degradation of the crystallinity of the second active layer 122.

However, the configuration of the second n-side semiconductor layer 121 is not limited to the configuration described above. For example, the second n-side semiconductor layer 121 may further include one or more undoped semiconductor layers. The undoped semiconductor layer of the second n-side semiconductor layer 121 includes, for example, GaN. Also, the second n-side semiconductor layer 121 may not include the fourth layer 121c.

The second active layer 122 has, for example, a multi-quantum well structure that includes multiple well layers and multiple barrier layers. The multiple well layers can include, for example, indium gallium nitride (InGaN). The multiple barrier layers can include, for example, GaN. The well layer and the barrier layer may be, for example, undoped semiconductor layers. At least portions of the well layer and the barrier layer may include an n-type impurity and/or a p-type impurity. The second p-side semiconductor layer 123 is located on the second active layer 122.

The second p-side semiconductor layer 123 includes, for example, one or more p-type semiconductor layers. The p-type semiconductor layer of the second p-side semiconductor layer 123 includes, for example, GaN doped with Mg as the p-type impurity. The p-type semiconductor layer of the second p-side semiconductor layer 123 may further include Al.

It is sufficient for the second p-side semiconductor layer 123 to have a function of supplying holes to the second active layer 122, and the second p-side semiconductor layer 123 may further include one or more undoped semiconductor layers. The undoped semiconductor layer of the second p-side semiconductor layer 123 includes, for example, GaN. The undoped semiconductor layer of the second p-side semiconductor layer 123 may further include Al.

As shown in FIG. 1, the n-side electrode 13 is located on the first surface 112s1 of the first n-side semiconductor layer 112. The n-side electrode 13 is electrically connected to the first n-side semiconductor layer 112. The p-side electrode 14 is located on the second p-side semiconductor layer 123. The p-side electrode 14 is electrically connected to the second p-side semiconductor layer 123. The first active layer 113 and the second active layer 122 are caused to emit light by applying a forward voltage $V_f$ between the n-side electrode 13 and the p-side electrode 14.

The light that is emitted by the first and second active layers 113 and 122 is, for example, ultraviolet light or visible light. The light emission peak wavelength of the first active layer 113 and the light emission peak wavelength of the second active layer 122 can be the same. For example, the first active layer 113 and the second active layer 122 may emit blue light. The light emission peak wavelength of the first active layer 113 and the light emission peak wavelength of the second active layer 122 may be different. For example, the first active layer 113 may emit blue light, and the second active layer 122 may emit green light. The light emission peak wavelength of the blue light is, for example, not less than 430 nm and not more than 490 nm. The light emission peak wavelength of the green light is, for example, not less than 500 nm and not more than 540 nm. The light emission peak wavelength of the ultraviolet light is not more than 400 nm.

A reverse bias is applied between the second n-side semiconductor layer 121 and the first p-side semiconductor layer 114 when the forward voltage $V_f$ is applied between the n-side electrode 13 and the p-side electrode 14, that is, when a positive potential is applied to the p-side electrode 14 and a potential that is less than that of the p-side electrode 14 is applied to the n-side electrode 13. Therefore, a tunnel effect due to the tunnel junction of the second n-side semiconductor layer 121 with the first p-side semiconductor layer 114 is utilized to cause a current to flow between the second n-side semiconductor layer 121 and the first p-side semiconductor layer 114. Specifically, the current flows between the second n-side semiconductor layer 121 and the first p-side semiconductor layer 114 by electrons of the valence band of the first p-side semiconductor layer 114 tunneling to the conduction band of the second n-side semiconductor layer 121. In other words, the second n-side semiconductor layer 121 has a tunnel junction with the first p-side semiconductor layer 114 if a current flows between the second n-side semiconductor layer 121 and the first p-side semiconductor layer 114 when the forward voltage $V_f$ is applied to the light-emitting element 10.

By increasing the impurity concentrations of each conductivity type included in the p-type semiconductor layer and the n-type semiconductor layer forming the p-n junction of the first p-side semiconductor layer 114 and the second n-side semiconductor layer 121, the width of the depletion layer formed by the p-n junction can be reduced. When the voltage is applied, the electrons of the valence band of the first p-side semiconductor layer 114 tunnel into the conduction band of the second n-side semiconductor layer 121 more easily as the width of the depletion layer decreases.

A method for manufacturing the light-emitting element 10 will now be described.

Figure 4:
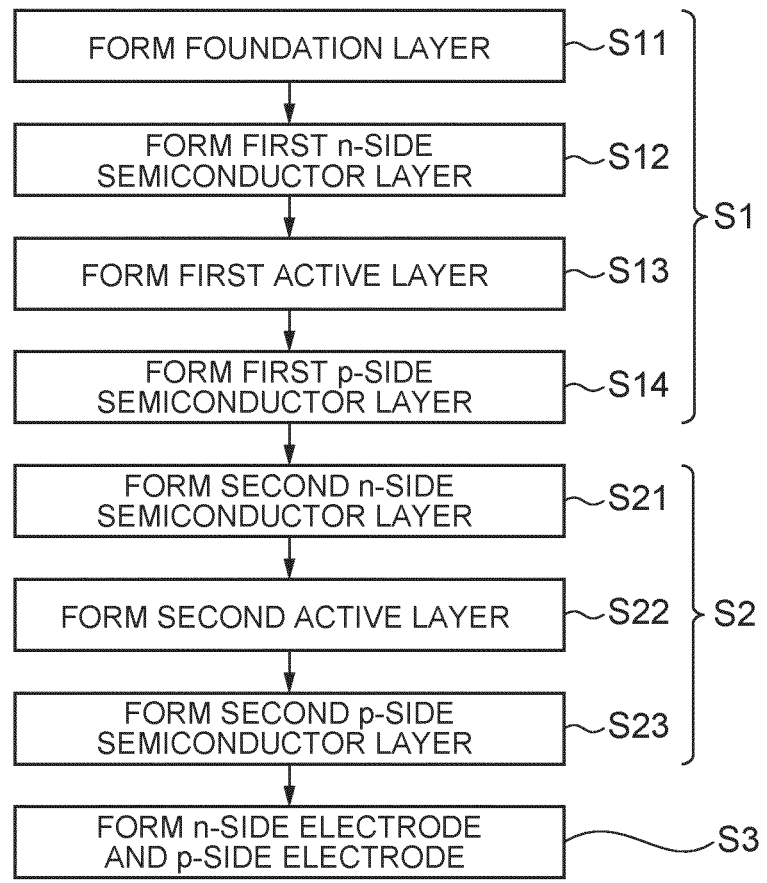
FIG. 4 is a flowchart showing the method for manufacturing the light-emitting element according to the embodiment.

FIG. 4 is a flowchart showing the method for manufacturing the light-emitting element 10 according to the embodiment.

Figure 5:
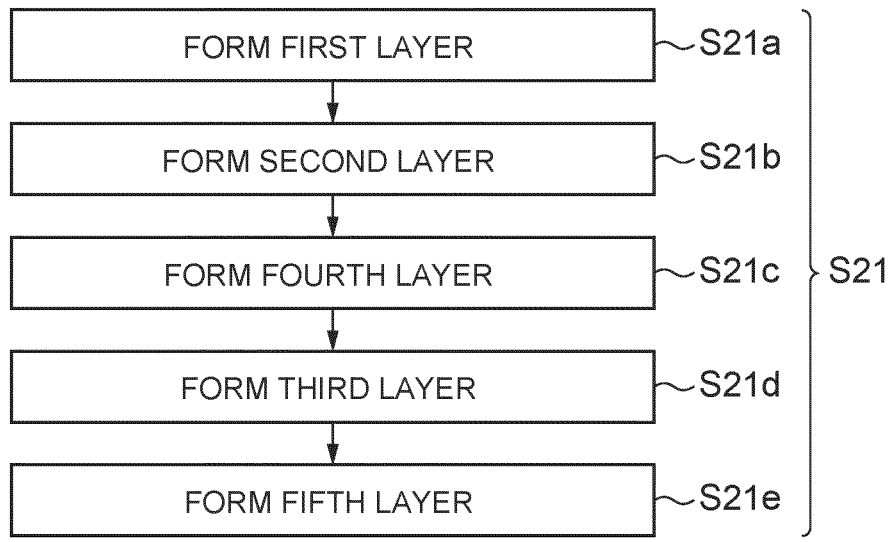
FIG. 5 is a flowchart showing details of a process of forming the second n-side semiconductor layer.

FIG. 5 is a flowchart showing details of a process S21 of forming the second n-side semiconductor layer 121.

Figure 6:
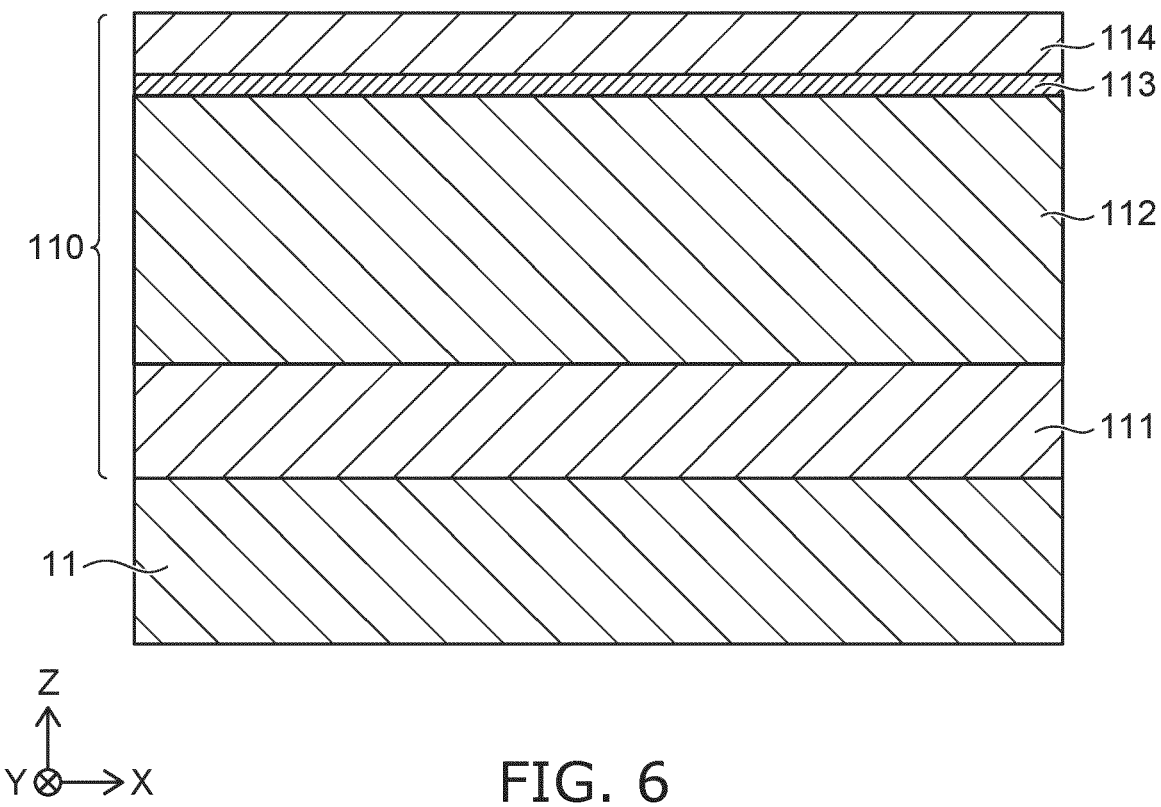
FIG. 6 is a cross-sectional view illustrating manufacturing processes of the light-emitting element according to the embodiment.

FIG. 6 is a cross-sectional view illustrating manufacturing processes of the light-emitting element 10 according to the embodiment.

Figure 7:
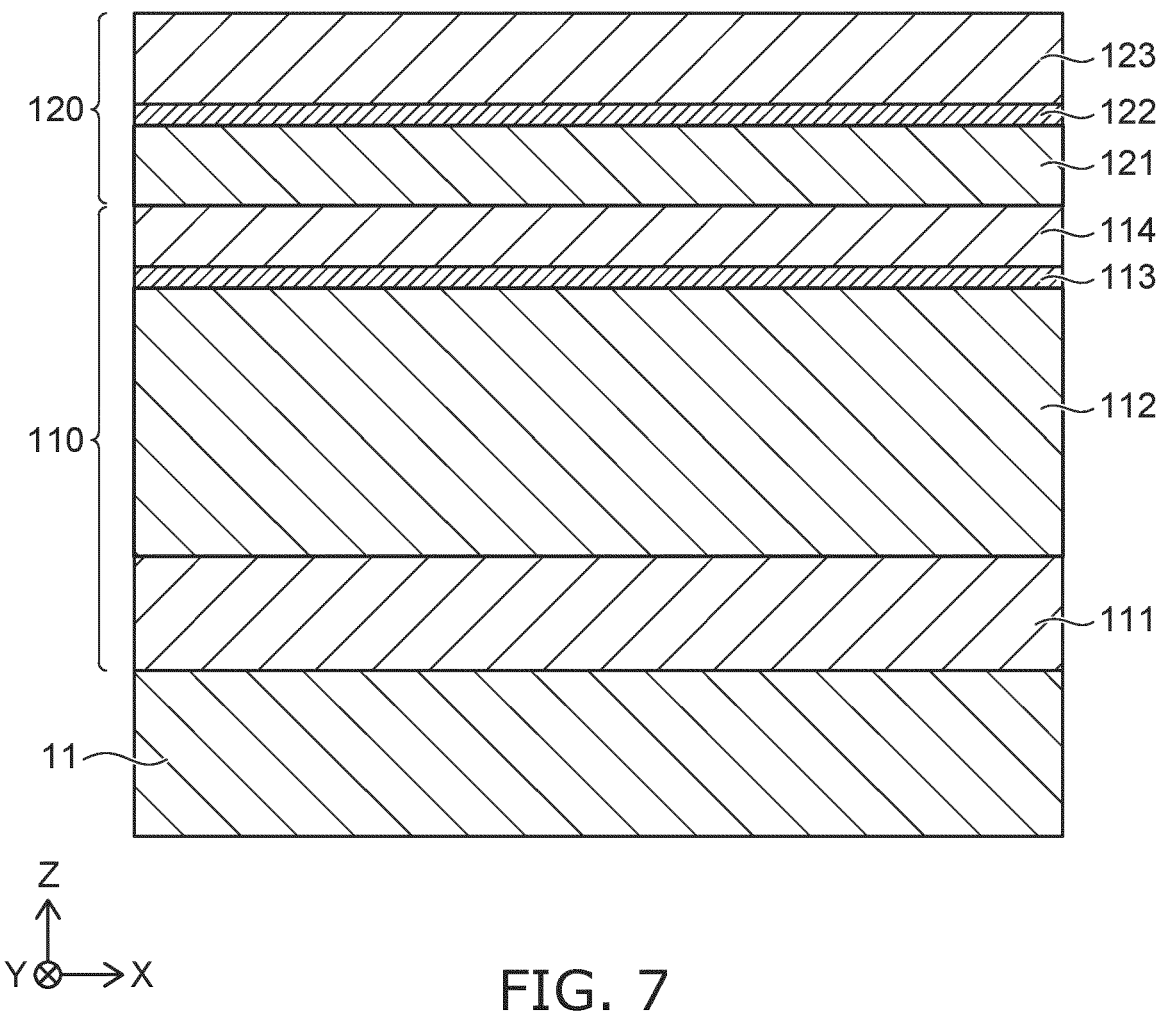
FIG. 7 is a cross-sectional view illustrating manufacturing processes of the light-emitting element according to the embodiment.

FIG. 7 is a cross-sectional view illustrating manufacturing processes of the light-emitting element 10 according to the embodiment.

As shown in FIG. 4, the method for manufacturing the light-emitting element 10 includes a process S1 of forming the first light-emitting part 110, a process S2 of forming the second light-emitting part 120, and a process S3 of forming the n-side electrode 13 and the p-side electrode 14.

For example, the first light-emitting part 110 and the second light-emitting part 120 that are included in the semiconductor structure body 12 are formed by MOCVD (metal organic chemical vapor deposition) in a furnace in which the pressure and the temperature can be adjusted. Specifically, the semiconductor structure body 12 is formed on the substrate 11 by supplying a carrier gas and a raw material gas to the furnace.

For example, hydrogen ($H_2$) gas, nitrogen ($N_2$) gas, etc., can be used as the carrier gas.

The raw material gas is appropriately selected according to the semiconductor layer to be formed. When a semiconductor layer that includes Ga is formed, for example, a raw material gas that includes Ga, such as trimethylgallium (TMG) gas, triethylgallium (TEG) gas, or the like is used. When forming a semiconductor layer that includes N, for example, a raw material gas that includes N, such as ammonia (NH$_3$) gas or the like is used. When forming a semiconductor layer that includes Al, for example, a raw material gas that includes Al, such as trimethylaluminum (TMA) gas or the like is used. When forming a semiconductor layer that includes In, for example, a raw material gas that includes In, such as trimethylindium (TMI) or the like is used. When forming a semiconductor layer that includes Si, for example, a gas that includes Si, such as monosilane (SiH$_4$) gas or the like is used. When forming a semiconductor layer that includes Mg, for example, a raw material gas that includes Mg, such as bis cyclopentadienyl magnesium (Cp$_2$Mg) gas or the like is used. Hereinbelow, the supply of a raw material gas that includes one element and a raw material gas that includes another element to the furnace also is called simply "supplying a raw material gas that includes one element and another element." The processes will now be elaborated.

First, the process S1 of forming the first light-emitting part 110 is performed.

The process S1 of forming the first light-emitting part 110 includes a process S11 of forming the foundation layer 111, a process S12 of forming the first n-side semiconductor layer 112, a process S13 of forming the first active layer 113, and a process S14 of forming the first p-side semiconductor layer 114.

In the process S11 of forming the foundation layer 111, a carrier gas and a raw material gas that correspond to the foundation layer 111 are supplied to the furnace. Thereby, the foundation layer 111 is formed on the substrate 11.

In the process S12 of forming the first n-side semiconductor layer 112, a carrier gas and a raw material gas that correspond to the first n-side semiconductor layer 112 are supplied to the furnace. Thereby, the first n-side semiconductor layer 112 is formed on the foundation layer 111.

The process S13 of forming the first active layer 113 supplies a carrier gas and a raw material gas corresponding to the first active layer 113 to the furnace. Thereby, the first active layer 113 is formed on the first n-side semiconductor layer 112.

In the process S14 of forming the first p-side semiconductor layer 114, a carrier gas and a raw material gas that correspond to the first p-side semiconductor layer 114 are supplied to the furnace. Thereby, the first p-side semiconductor layer 114 is formed on the first active layer 113.

Thus, as shown in FIG. 6, the first light-emitting part 110 that includes the foundation layer 111, the first n-side semiconductor layer 112, the first active layer 113, and the first p-side semiconductor layer 114 is formed on the substrate 11.

Then, the process S2 of forming the second light-emitting part 120 is performed.

As shown in FIG. 4, the process S2 of forming the second light-emitting part 120 includes the process S21 of forming the second n-side semiconductor layer 121, a process S22 of forming the second active layer 122, and a process S23 of forming the second p-side semiconductor layer 123.

According to the embodiment as shown in FIG. 5, the process S21 of forming the second n-side semiconductor layer 121 includes a process S21a of forming the first layer 121a, a process S21b of forming the second layer 121b, a process S21c of forming the fourth layer 121c, a process S21d of forming the third layer 121d, and a process S21e of forming the fifth layer 121e.

In the process S21a of forming the first layer 121a, a carrier gas, a raw material gas that includes In, Ga, and N, and a raw material gas that includes Si as an n-type impurity are supplied. Thereby, the first layer 121a that is made of an InGaN layer doped with Si is formed on the first p-side semiconductor layer 114.

In the process S21b of forming the second layer 121b, a carrier gas, a raw material gas that includes In, Ga, and N, and a raw material gas that includes Si as an n-type impurity are supplied. Thereby, the second layer 121b that is made of an InGaN layer doped with Si is formed on the first layer 121a. At this time, the flow rates of the raw material gas including In, the raw material gas including Ga, the raw material gas including N, and the raw material gas including Si are adjusted so that the second n-type impurity concentration is less than the first n-type impurity concentration and the value of the In composition ratio of the second layer 121b is less than the value of the In composition ratio of the first layer 121a. Also, the thickness t2 of the second layer 121b is formed to be greater than the thickness t1 of the first layer 121a. For example, the thicknesses of the semiconductor layers can be adjusted by appropriately modifying the formation times of the semiconductor layers.

In the process S21c of forming the fourth layer 121c, a carrier gas, a raw material gas that includes Al, Ga, and N, and a raw material gas that includes Si as an n-type impurity are supplied. Thereby, the fourth layer 121c that is made of an AlGaN layer doped with Si is formed on the second layer 121b. At this time, the flow rates of the raw material gas including Al, the raw material gas including Ga, the raw material gas including N, and the raw material gas including Si are adjusted so that the fourth n-type impurity concentration is not more than the second n-type impurity concentration. However, as described above, the fourth n-type impurity concentration may be greater than the second n-type impurity concentration. Also, the thickness t4 of the fourth layer 121c is formed to be greater than the thickness t1 of the first layer 121a and less than the thickness t2 of the second layer 121b. However, as described above, the thickness t4 may be not less than the thickness t2.

In the process S21d of forming the third layer 121d, a carrier gas, a raw material gas that includes Ga and N, and a raw material gas that includes Si as an n-type impurity are supplied. Thereby, the third layer 121d that is made of a GaN layer doped with Si is formed on the fourth layer 121c. At this time, the flow rates of the raw material gas including Ga, the raw material gas including N, and the raw material gas including Si are adjusted so that the third n-type impurity concentration is less than the second n-type impurity concentration and the fourth n-type impurity concentration. Also, the thickness t3 of the third layer 121d is formed to be greater than the thickness t2 of the second layer 121b. However, as described above, the thickness t3 may be the thickness t2 or less.

In the process S21e of forming the fifth layer 121e, a GaN layer that is doped with Si as an n-type impurity and an InGaN layer that is doped with Si as an n-type impurity are alternately formed on the third layer 121d. The GaN layer that is doped with Si is formed by supplying a carrier gas, a raw material gas that includes Ga and N, and a raw material gas that includes Si to the furnace. The InGaN layer that is doped with Si is formed by supplying a carrier gas, a raw material gas that includes In, Ga, and N, and a raw material gas that includes Si to the furnace.

The process S22 of forming the second active layer 122 supplies a carrier gas and a raw material gas that correspond to the second active layer 122 to the furnace. Thereby, the second active layer 122 is formed on the second n-side semiconductor layer 121.

In the process S23 of forming the second p-side semiconductor layer 123, a carrier gas and a raw material gas that correspond to the second p-side semiconductor layer 123 are supplied to the furnace. Thereby, the second p-side semiconductor layer 123 is formed on the second active layer 122.

Thus, as shown in FIG. 7, the second light-emitting part 120 that includes the second n-side semiconductor layer 121, the second active layer 122, and the second p-side semiconductor layer 123 is formed on the first light-emitting part 110.

Then, the process S3 of forming the n-side electrode 13 and the p-side electrode 14 is performed.

In the process S3 of forming the n-side electrode 13 and the p-side electrode 14, first, the first and third surfaces 112s1 and 112s3 of the first n-side semiconductor layer 112 are exposed at the first active layer 113, the first p-side semiconductor layer 114, and the second light-emitting part 120 by removing a portion of the semiconductor structure body 12 as shown in FIG. 1. For example, a portion of the semiconductor structure body 12 can be removed by selectively etching by using a resist.

Then, the n-side electrode 13 is formed on the exposed first surface 112s1. The p-side electrode 14 is formed on the second p-side semiconductor layer 123. For example, the n-side electrode 13 and the p-side electrode 14 can be formed by sputtering or vapor deposition.

Thus, the light-emitting element 10 can be obtained. However, the method for manufacturing the light-emitting element 10 is not limited to the method described above. For example, the method for manufacturing the light-emitting element 10 may not include the process S11 of forming the foundation layer 111, and the first n-side semiconductor layer 112 may be directly formed on the substrate 11.

Effects of the embodiment will now be described.

The light-emitting element 10 according to the embodiment includes the first n-side semiconductor layer 112, the first active layer 113, the first p-side semiconductor layer 114, the second n-side semiconductor layer 121 contacting the first p-side semiconductor layer 114, the second active layer 122, and the second p-side semiconductor layer 123 that are made of nitride semiconductors successively from a lower side to an upper side. The second n-side semiconductor layer 121 includes the first layer 121a, the second layer 121b, and the third layer 121d successively from a lower side to an upper side. The first layer 121a includes In and Ga and has the first n-type impurity concentration. The second layer 121b includes In and Ga and has the second n-type impurity concentration that is less than the first n-type impurity concentration. The value of the In composition ratio of the second layer 121b is less than the value of the In composition ratio of the first layer 121a. The thickness t2 of the second layer 121b is greater than the thickness t1 of the first layer 121a. The third layer 121d includes Ga and has the third n-type impurity concentration that is less than the second n-type impurity concentration.

By setting the In composition ratio of the first layer 121a to be high and the first n-type impurity concentration to be high, a current flows more easily between the second n-side semiconductor layer 121 and the first p-side semiconductor layer 114 when the forward voltage $V_f$ is applied to the light-emitting element 10. The degradation of the crystallinity of the first layer 121a can be reduced by reducing the thickness t1 of the first layer 121a. On the other hand, the In composition ratio of the second layer 121b is less than the In composition ratio of the first layer 121a, the second n-type impurity concentration is less than the first n-type impurity concentration, and the thickness t2 of the second layer 121b is greater than the thickness t1 of the first layer 121a. Thereby, the carrier density at the vicinity of the p-n junction portion formed by the first p-side semiconductor layer 114 and the second n-side semiconductor layer 121 can be increased while reducing the degradation of the crystallinity of the second layer 121b. The occurrence of point defects in the second layer 121b can be reduced, and the diffusion of the p-type impurity included in the first p-side semiconductor layer 114 into the semiconductor layers positioned higher than the second layer 121b, such as the third layer 121d, etc., can be reduced. As a result, the forward voltage $V_f$ can be reduced. The crystallinity can be further improved by forming the third layer 121d on the second layer 121b and by setting the third n-type impurity concentration to be less than the second n-type impurity concentration. Therefore, the degradation of the crystallinity of the second active layer 122 and the like that are higher than the third layer 121d can be reduced.

The thickness t2 of the second layer 121b is less than the thickness t3 of the third layer 121d. Therefore, the degradation of the crystallinity of the second layer 121b can be reduced, and the point defects that occur when forming the semiconductor layers lower than the third layer 121d, such as the first layer 121a, etc., can be easily filled with the third layer 121d. The crystallinity can be improved thereby, and the surface state of the third layer 121d can approach flat. Therefore, the degradation of the crystallinity of the semiconductor layers, such as the second active layer 122 or the like that are higher than the third layer 121d, can be reduced.

The second n-side semiconductor layer 121 further includes the fourth layer 121c located between the second layer 121b and the third layer 121d. The fourth layer 121c includes Al and Ga and has the fourth n-type impurity concentration that is greater than the third n-type impurity concentration. By such a fourth layer 121c that includes Al, the point defects that occur when forming the semiconductor layers lower than the fourth layer 121c can be filled, and the surface state of the fourth layer 121c can approach flat. The degradation of the crystallinity of the semiconductor layers that are higher than the fourth layer 121c can be reduced thereby.

The fourth n-type impurity concentration is not more than the second n-type impurity concentration. Therefore, the degradation of the crystallinity can be reduced by the fourth layer 121c while the second layer 121b ensures the carrier density at the vicinity of the p-n junction portion formed by the first p-side semiconductor layer 114 and the second n-side semiconductor layer 121.

EXAMPLES

An example and a reference example will now be described.

Figure 8:
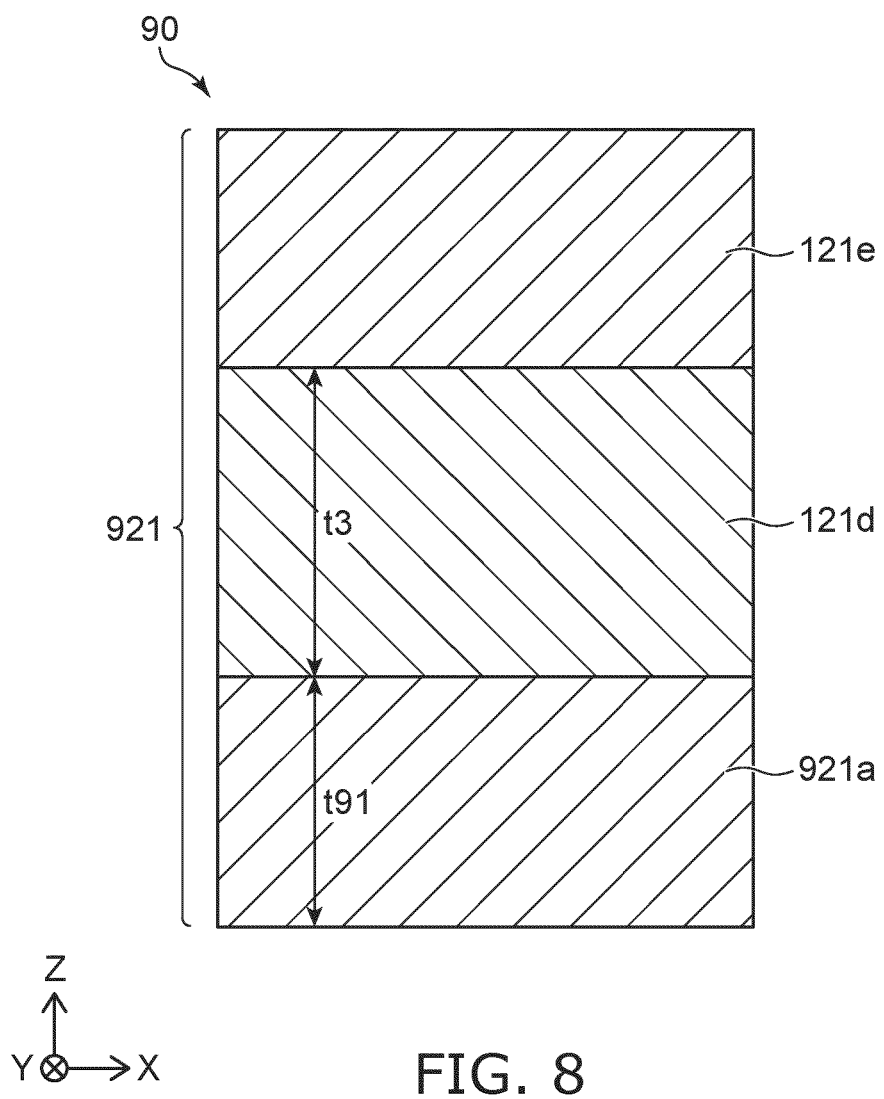
FIG. 8 is a cross-sectional view showing the layer configuration of a second n-side semiconductor layer of a light-emitting element according to a reference example.

FIG. 8 is a cross-sectional view showing the layer configuration of a second n-side semiconductor layer 921 of a light-emitting element 90 according to a reference example.

The light-emitting element 10 according to the example and the light-emitting element 90 according to the reference example were made. The light-emitting element 10 according to the example had a layer configuration similar to that of the light-emitting element 10 shown in FIGS. 1 and 2.

The light-emitting element 90 according to the reference example differed from the light-emitting element 10 according to the example in that the first layer 121a, the second layer 121b, and the fourth layer 121c shown in FIG. 2 were replaced with a GaN layer (hereinbelow, called a "lowermost layer 921a") doped with Si; otherwise, the layer configuration was made to be common with the light-emitting element 10. A method for manufacturing the light-emitting elements 10 and 90 will now be elaborated.

First, the foundation layer 111 that included an undoped GaN layer and had a thickness of about 3 μm was formed on the substrate 11 made of sapphire.

Then, the first n-side semiconductor layer 112 that had a thickness of about 9 μm and included a GaN layer doped with Si and an undoped GaN layer was formed on the foundation layer 111.

Continuing, the first active layer 113 that had a thickness of about 55 nm and included multiple barrier layers including undoped GaN layers and multiple well layers including undoped InGaN layers was formed on the first n-side semiconductor layer 112. The first active layer 113 was formed to include seven pairs of the barrier layer and the well layer.

Then, the first p-side semiconductor layer 114 that included a GaN layer doped with Mg and had a thickness of about 85 nm was formed on the first active layer 113.

Continuing, on the first p-side semiconductor layer 114, the second n-side semiconductor layer 921 was formed in the reference example, and the second n-side semiconductor layer 121 was formed in the example.

As shown in FIG. 8, the second n-side semiconductor layer 921 of the reference example included the lowermost layer 921a, the third layer 121d, and the fifth layer 121e successively from a lower side to an upper side. The lowermost layer 921a was made of a GaN layer doped with Si, and a thickness t91 of the lowermost layer 921a was about 35 nm. The third layer 121d was made of a GaN layer doped with Si, and the thickness t3 of the third layer 121d was about 100 nm. The third n-type impurity concentration of the third layer 121d was less than the n-type impurity concentration of the lowermost layer 921a. The n-type impurity concentration of the lowermost layer 921a was equal to the second n-type impurity concentration of the second layer 121b of the example. The fifth layer 121e included a stacked body in which a GaN layer doped with Si and an InGaN layer doped with Si were alternately stacked, and had a thickness of about 56 nm.

As shown in FIG. 2, the second n-side semiconductor layer 121 of the example included the first layer 121a, the second layer 121b, the fourth layer 121c, the third layer 121d, and the fifth layer 121e successively from a lower side to an upper side.

The first layer 121a was made of an InGaN layer doped with Si, and the thickness t1 of the first layer 121a was about 1 nm. The value of the In composition ratio of the first layer 121a was about 35%.

The second layer 121b was made of an InGaN layer doped with Si, and the thickness t2 of the second layer 121b was about 20 nm. The value of the In composition ratio of the second layer 121b was about 1%. The second n-type impurity concentration of the second layer 121b was less than the first n-type impurity concentration of the first layer 121a.

The fourth layer 121c was made of an AlGaN layer doped with Si, and the thickness t4 of the fourth layer 121c was about 15 nm. The fourth n-type impurity concentration of the fourth layer 121c was equal to the second n-type impurity concentration of the second layer 121b.

The third layer 121d of the example was formed similarly to the third layer 121d of the reference example, and the fifth layer 121e of the example was formed similarly to the fifth layer 121e of the reference example.

Then, the second active layer 122 that had a thickness of about 55 nm and included multiple barrier layers including undoped GaN layers and multiple well layers including undoped InGaN layers was formed on the second n-side semiconductor layers 121 and 921. The second active layer 122 was formed to include seven pairs of the barrier layer and the well layer.

Continuing, the second p-side semiconductor layer 123 that included a GaN layer doped with Mg and had a thickness of about 115 nm was formed on the second active layer 122.

Then, portions of the first n-side semiconductor layer 112, the first active layer 113, the first p-side semiconductor layer 114, the second n-side semiconductor layers 121 and 921, the second active layer 122, and the second p-side semiconductor layer 123 were removed, the n-side electrode 13 was formed on the exposed first n-side semiconductor layer 112, and the p-side electrode 14 was formed on the second p-side semiconductor layer.

Figure 9A:
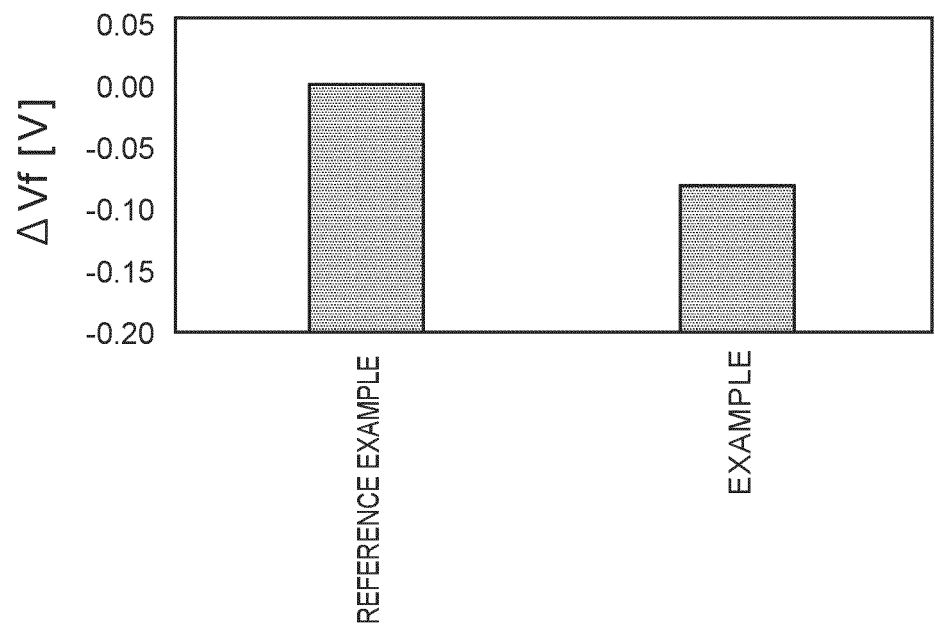
FIG. 9A is a graph showing a difference $\Delta V_f$ between the forward voltage $V_f$ and a forward voltage $V_{fref}$ used as the reference for the light-emitting element according to the reference example and the light-emitting element according to the example.

FIG. 9A is a graph showing a difference $\Delta V_f$ between the forward voltage $V_f$ and a forward voltage $V_{fref}$ used as the reference for the light-emitting element 90 according to the reference example and the light-emitting element 10 according to the example.

Figure 9B:
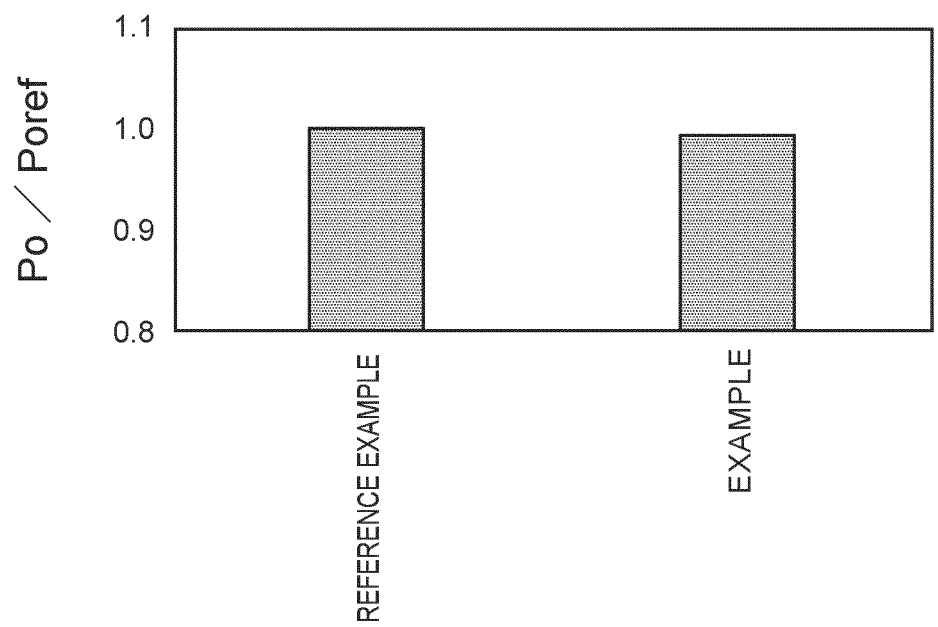
FIG. 9B is a graph showing values $P_o/P_{oref}$ of P normalized outputs $P_o$ of the light-emitting element according to the reference example and the light-emitting element according to the example.

FIG. 9B is a graph showing values $P_o/P_{oref}$ of P normalized outputs $P_o$ of the light-emitting element 90 according to the reference example and the light-emitting element 10 according to the example.

The forward voltages $V_f$ were measured for the light-emitting element 90 according to the reference example and the light-emitting element 10 according to the example. The results are shown in FIG. 9A. The forward voltage $V_f$ of the reference example was used as the reference forward voltage $V_{fref}$, and the vertical axis of FIG. 9A is the values of the reference forward voltage $V_{fref}$ subtracted from the measured forward voltages $V_f$. In other words, $\Delta V_f = V_f - V_{fref}$.

The outputs $P_o$ were measured for the light-emitting elements according to the reference example and the example. The results are shown in FIG. 9B. The output $P_o$ of the reference example was used as the reference output $P_{oref}$, and the vertical axis of FIG. 9B is values of the measured outputs $P_o$ normalized by dividing by the reference output $P_{oref}$.

As shown in FIG. 9A, the forward voltage $V_f$ of the light-emitting element 10 according to the example was less than the forward voltage $V_f$ of the light-emitting element 90 according to the reference example. As shown in FIG. 9B, the output $P_o$ of the light-emitting element 10 according to the example was substantially equal to the output $P_o$ of the light-emitting element 90 according to the reference example. Accordingly, it was found that the forward voltage $V_f$ can be reduced while maintaining the output $P_o$ by including the first layer 121a, the second layer 121b, and the fourth layer 121c in the second n-side semiconductor layer 121.

According to an embodiment of the invention, a light-emitting element that has a low forward voltage can be provided.

What is claimed is:
1. A light-emitting element, comprising:
successively from a lower side to an upper side, a first n-side semiconductor layer, a first active layer, a first p-side semiconductor layer, a second n-side semiconductor layer, a second active layer, and a second p-side semiconductor layer, each of which is made of a nitride semiconductor; wherein:

the second n-side semiconductor layer contacts the first p-side semiconductor layer;

the second n-side semiconductor layer comprises, successively from a lower side to an upper side, a first layer, a second layer, and a third layer;

the first layer comprises indium and gallium and has a first n-type impurity concentration;

the second layer comprises indium and gallium and has a second n-type impurity concentration less than the first n-type impurity concentration;

a value of a composition ratio of indium in the second layer is less than a value of a composition ratio of indium in the first layer;

a thickness of the second layer is greater than a thickness of the first layer;

the third layer comprises gallium and has a third n-type impurity concentration less than the second n-type impurity concentration.

2. The element according to claim 1, wherein:
the thickness of the second layer is less than a thickness of the third layer.

3. The element according to claim 1, wherein:
the second n-side semiconductor layer further comprises a fourth layer located between the second layer and the third layer; and
the fourth layer includes aluminum and gallium and has a fourth n-type impurity concentration greater than the third n-type impurity concentration.

4. The element according to claim 2, wherein:
the second n-side semiconductor layer further comprises a fourth layer located between the second layer and the third layer; and
the fourth layer includes aluminum and gallium and has a fourth n-type impurity concentration greater than the third n-type impurity concentration.

5. The element according to claim 3, wherein:
the fourth n-type impurity concentration is not more than the second n-type impurity concentration.

6. The element according to claim 4, wherein:
the fourth n-type impurity concentration is not more than the second n-type impurity concentration.

7. The element according to claim 1, wherein:
the thickness of the first layer is not less than 0.1 nm and not more than 2 nm.

8. The element according to claim 2, wherein:
the thickness of the first layer is not less than 0.1 nm and not more than 2 nm.

9. The element according to claim 3, wherein:
the thickness of the first layer is not less than 0.1 nm and not more than 2 nm.

10. The element according to claim 1, wherein:
the thickness of the second layer is not less than 10 nm and not more than 40 nm.

11. The element according to claim 2, wherein:
the thickness of the second layer is not less than 10 nm and not more than 40 nm.

12. The element according to claim 3, wherein:
the thickness of the second layer is not less than 10 nm and not more than 40 nm.

13. The element according to claim 7, wherein:
the thickness of the second layer is not less than 10 nm and not more than 40 nm.

14. The element according to claim 1, wherein:
the first layer and the second layer are indium gallium nitride layers doped with n-type impurities; and
the third layer is a gallium nitride layer doped with an n-type impurity.

15. The element according to claim 2, wherein:
the first layer and the second layer are indium gallium nitride layers doped with n-type impurities; and
the third layer is a gallium nitride layer doped with an n-type impurity.

16. The element according to claim 3, wherein:
the first layer and the second layer are indium gallium nitride layers doped with n-type impurities; and
the third layer is a gallium nitride layer doped with an n-type impurity.

* * * * *